United States Patent
Newns

[11] Patent Number: 6,121,642
[45] Date of Patent: Sep. 19, 2000

[54] JUNCTION MOTT TRANSITION FIELD EFFECT TRANSISTOR (JMTFET) AND SWITCH FOR LOGIC AND MEMORY APPLICATIONS

[75] Inventor: Dennis Merton Newns, Yorktown Heights, N.Y.

[73] Assignee: International Business Machines Corporation, Armonk, N.Y.

[21] Appl. No.: 09/119,182

[22] Filed: Jul. 20, 1998

[51] Int. Cl.[7] .......................... H01L 29/12; H01L 29/772
[52] U.S. Cl. .......................... 257/192; 257/43; 257/279; 257/289; 257/295; 257/410
[58] Field of Search .................................. 257/192, 279, 257/289, 295, 410, 43

[56] References Cited

U.S. PATENT DOCUMENTS

| | | | |
|---|---|---|---|
| 4,583,105 | 4/1986 | Rosenberg | 257/289 |
| 5,418,389 | 5/1995 | Watanabe | 257/295 |
| 5,623,439 | 4/1997 | Gotoh | 257/295 |
| 5,686,745 | 11/1997 | Lin et al. | 257/295 |

OTHER PUBLICATIONS

Zhou et al, "A field effect . . . layer" *Appl. Phys. Lett* 70(5) Feb. 3, 1997 pp. 598–600.

*Primary Examiner*—Jerome Jackson, Jr.
*Attorney, Agent, or Firm*—McGinn & Gibb, P.C.

[57] ABSTRACT

A device includes first and second contacts formed on a channel material, a film of doped first insulator material interposed between the first and second contacts, and a second insulator material interfaced with the doped first insulator material with an area of said channel material therebetween. The second insulator material is doped so as to have carriers of opposite charge to those in the channel material.

24 Claims, 7 Drawing Sheets

JUNCTION MOTT TRANSITION FIELD EFFECT TRANSISTOR (JMTFET) AND SWITCH FOR LOGIC AND MEMORY APPLICATIONS

CROSS-REFERENCE TO RELATED APPLICATION

The present application is related to U.S. patent application Ser. No. 09/119,185, filed on Jul. 20, 1998, to D. M. Newns, having IBM Docket No. Y0998-176, assigned to the present assignee, and incorporated herein by reference.

BACKGROUND OF THE INVENTION

1. Field of the Invention

The present invention generally relates to a thin film electronic component, and more particularly to a very thin film junction Mott transition field effect transistor (JMTFET), a dynamic random access memory (DRAM) incorporating the same, and a method of forming the JMTFET.

2. Description of the Related Art

Disregarding issues of lithography, the continuation of Moore's Law in scaling of digital circuits reaches a threshold when the dimensions of the MOSFET reaches the physical limits of the device.

Recently, a 60 nm. channel length has been announced as constituting this limit, which may be reduced further by technical advances such as dual gate technology and the like. However, practical considerations such as manufacturing reliability may impose a scaling limit before these physical limits are reached.

The function of the Si-based MOSFET is based on the presence in the channel of the device of a pair of back-to-back p-n junctions, each with an associated depletion layer. The thickness of the depletion layer is a key factor limiting the scaling of the MOSFET to arbitrarily small scales.

In a search for devices which may function as switches compatible with engineering criteria over an extended scaling region below the scales at which the conventional Si-based MOSFET becomes impracticable, the concept of a Mott Transition Field Effect Transistor (MTFET) has been proposed, as set forth in C. Zhou et al., *Appl. Phys. Lett.*, 70.598 (1997) and J. A. Misewich et al., U.S. patent application Ser. No. 08/652,286, filed May 22, 1996, commonly assigned and incorporated herein by reference.

The MTFET is an FET-type device where the channel is made from a material capable of undergoing a Mott metal-insulator transition. Transport in such a channel material essentially experiences a mobility transition as well as a change in carrier number as voltage on the gate changes.

When in its insulating state, the mobility and carrier concentration are low (e.g., mobility less than 0.1 cm/volt sec. and a carrier concentration less than 0.1% per unit cell).

When in the metallic state, there is a high carrier concentration with high mobility, enabling the channel to conduct. The channel function does not depend on a depletion layer or other phenomenon with an extended length scale. Hence, it is predicted to function adequately down to extremely small (e.g., 10 nm.) scales.

Thus, devices based on the Mott metal-insulator transition do not involve depletion layers within the operating channel, and scaling of the MTFET and derivatives, down to much smaller, nanoscopic, dimensions, may be possible.

However, a problem encountered with the use of high dielectric constant materials as gate insulators in both capacitor applications and in MTFET devices is that, when the gate insulator becomes very thin, to achieve switching with 1–2 volt gate signals, the dielectric constant tends to rapidly decrease. This prevents achieving desired turn-on gate voltages.

Thus, working MTFET devices have been realized in the framework of perovskite-based materials. These devices are typically formed by deposition of cuprate layers on to pre-deposited STO gate oxide film, but it is recognized that this process may limit the control of quality at the cuprate-STO interface, which is the most critical part for device performance.

SUMMARY OF THE INVENTION

In view of the foregoing and other problems of the conventional methods and structures, an object of the present invention is to provide a method and structure in which large carrier concentrations in the channel can be switched with low gate voltages.

Another object is to form the channel directly on high quality, stepped substrate surfaces.

Yet another object is to provide a DRAM incorporating the structure, and a method of forming the same such that desired turn-on gate voltages are met.

Another object is to provide a method and structure in which when using high dielectric constant materials as gate insulators and the gate insulators become very thin, to achieve switching with 1–2 volt gate signals, the dielectric constant is maintained to meet desired turn-on gate voltages.

In one aspect of the present invention, a device includes a channel material, first and second contacts formed on the channel material, a film of doped first insulator material interposed between the first and second contacts, and a second insulator material interfaced with the doped first insulator material with an area of the channel material therebetween. The second insulator material is doped so as to have carriers of opposite charge to those in the channel material.

In another aspect of the present invention, a dynamic random access memory (DRAM) is provided which includes a switch, the switch including a channel material, first and second contacts formed on the channel material, a film of doped first insulator material formed on the channel material and interposed between the first and second contacts, and a second insulator material interfaced with the doped first insulator material with the channel material therebetween.

Generally, the present invention provides a novel version of the MTFET approach, which possess certain advantages, as described below.

Specifically, the present invention provides a novel, modified type of MTFET device referred to as a Junction Mott Transition Field Effect Transistor (JMTFET). The device is related to the MTFET in somewhat the same manner as the JFET (Junction Field Effect Transistor) is related to the MOSFET (e.g., the gate oxide in the MOSFET is replaced by a depletion layer in the semiconducting material).

However, in the JMTFET, the gate insulator can be essentially the same material as the gate insulator in the MTFET, only it contains a small percentage (e.g., in a range of about 0.01% to about 10%) of dopant atoms.

With the unique and unobvious aspects of the present invention, the desired turn-on gate voltages are ensured.

With the invention, a cuprate/STO interface at the surface of a high quality manufacturer-prepared substrate crystal is formed with controlled step/terrace surface morphology.

To this end, a JMTFET device is formed in which, for example, cuprate is deposited directly on to a high-quality conducting n-type Nb-doped STO substrate. In the device, the gate oxide is not formed by deposition of an insulating film of pure STO, but rather by a depletion layer created by electrical forces within the Nb-doped substrate.

Hence, the present device provides a Junction Field Effect Transistor, in which the gate insulator is a depletion layer within doped silicon. However, it is similar to the conventional MTFET and thus easy to manufacture, in that the gate insulator merely differs from STO by the presence of an ionized dopant.

The Junction-type structure is well adapted to function in an inversion mode, where the carrier polarity in the channel material, whose dopant concentration in this case would be low, is inverted by the gate potential (e.g., from p-type as normal in cuprates to n-type). Operating in the inversion mode, a good on/off ratio would be obtained without requiring extremely thin layers of channel material.

BRIEF DESCRIPTION OF THE DRAWINGS

The foregoing and other purposes, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1A:
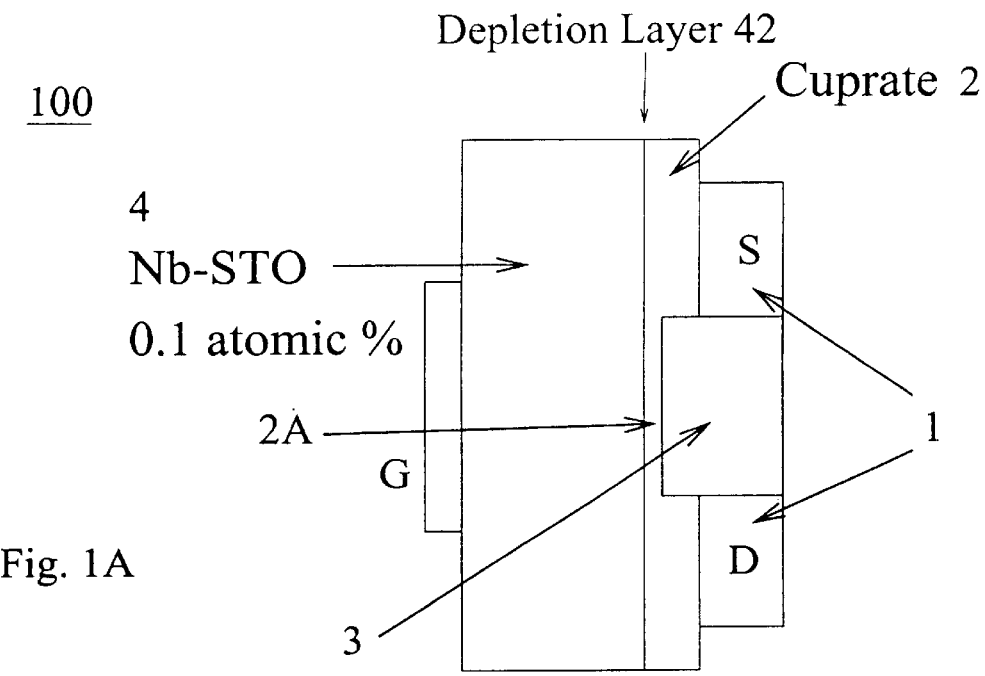
FIG. 1A illustrates a JMTFET structure including a p-type doped Mott insulator layer, with source and drain contacts, interfaced with n-type insulator substrate, forming both the gate insulator and the gate electrode.
Figure 1B:
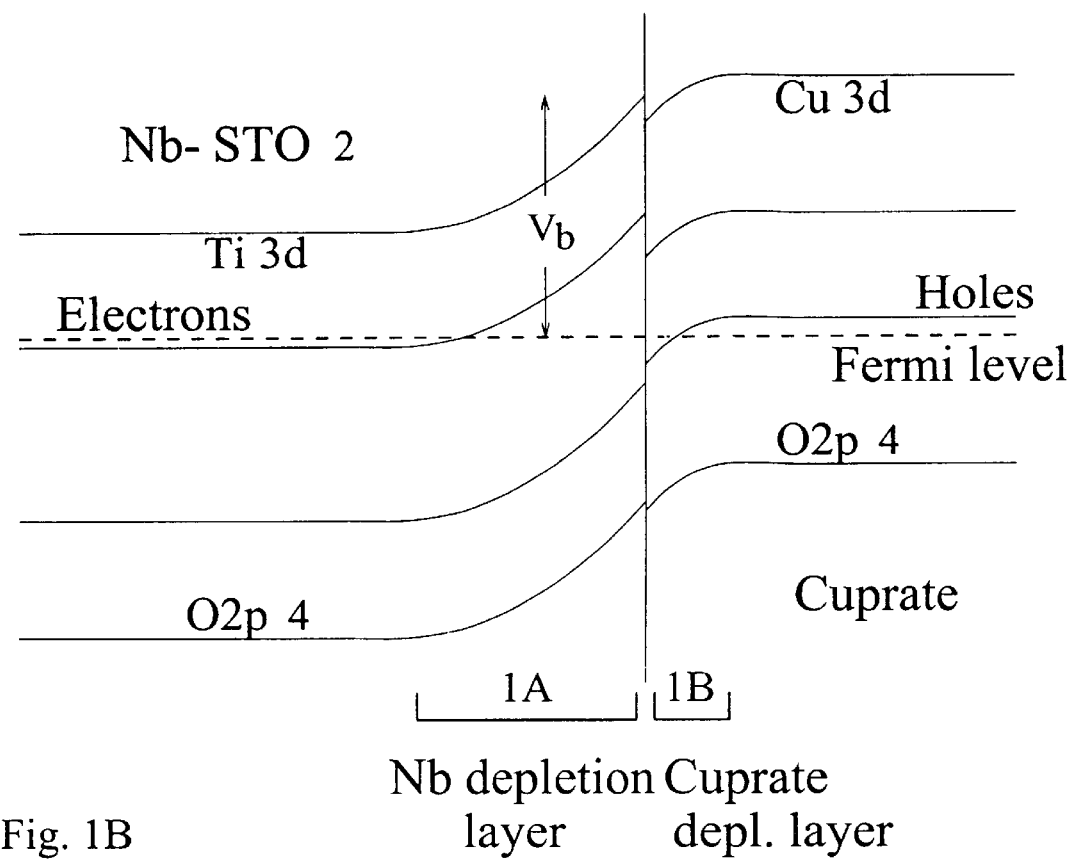
FIG. 1B illustrates band bending at the p-type/n-type interface, illustrating the formation of an inversion layer in the insulator material, which acts as the gate insulator, and a depletion layer in the p-type Mott insulator, driving it insulating when conducting material is present only in monolayer thicknesses.

Referring now to the drawings, and more particularly to FIGS. 1A–1B, there are shown embodiments of the method and structures according to the present invention.

Generally, the present invention provides a JMTFET in which the gate insulator is essentially the same material as the gate insulator in the MTFET, with the exception that it contains a small (e.g., about 0.01 to about 10%) percentage of dopant atoms.

Referring to FIG. 1A, an embodiment of the present invention is shown and specifically one form of the JMTFET device 100 is illustrated.

First and second contacts 1 (e.g., source and drain electrodes S, D) are separated by an active channel material 2 selected for its capability to undergo the Mott metal-insulator transition. For example, the channel material 2 may be p-type channel material (e.g., $Y_{0.5}Pr_{0.5}Ba_2Cu_3O_{7-\delta}$, $YBa_2Cu_3O_{7-\delta}$, $LaCuO_{4+\delta}$, and the like). Preferably, the contacts are formed of metal such as platinum and the like.

The part of the channel lying between the source and drain electrodes S, D includes a very thin layer 2A (e.g., containing of order one to a few layers of cuprate $CuO_2$ planes) of active material. This layer 2A is embedded in insulating material 3 which is formed for example of an epitaxial layer of nonconducting perovskite material. Layer 2A preferably has a thickness substantially within a range of about 3 nm. to about 30 nm, and more preferably about 10 nm. The insulating material 3 is otherwise closely compatible material to the active material thin layer 2A. For purposes of this application, "closely compatible" means forming an epitaxial layer and being compatible in processing.

The channel 2 is interfaced, preferably epitaxially, with a high dielectric constant material 4 preferably having a dielectric constant within a range about 200 to about 1000, and preferably at least 300. Such a high dielectric constant material 4 may be a ferroelectric perovskite such as STO (strontium titanate), doped with a relatively low concentration of an appropriate dopant element (e.g., Nb for STO). The STO preferably is n-doped, but may have any conductivity-type depending upon the designer's constraints and requirements. It is noted that barium strontium titanate (BST) could be employed instead of STO.

The high dielectric constant material 4 is fixed along the channel material 2, and preferably has a thickness substantially within a range of about 100 nm to about 1 cm. Assuming that the STO is n-doped, the dielectric material 4 is n-type (see FIG. 1A). The channel material 2 must have an opposite carrier-type to the dielectric material 4. Thus, if the channel material 2 is n-type, then it will be assumed that the dielectric material 4 is p-type.

For example, the high dielectric constant material 4 may be a layered cuprate material of the family related to high temperature superconductors or the like, another p-type perovskite material such as $La_xSr_{1-x}MnO_3$, or another p-type material preferably capable of forming an epitaxial interface with the dielectric 4. Further, the bands in the p-type material should approximately line up (e.g., be aligned) with those of the n-type material at the interface, as shown in FIG. 1B.

When the two interfaced materials (e.g., layers 2 and 4) are in equilibrium at zero bias, a depletion layer is formed. Most of the depletion layer resides in the dielectric material 4 (e.g., see D. M. Newns et al., "The JMTFET: a Reductionist but Potent MTFET Device", *IBM Report*, publication date to be determined, incorporated herein by reference, for details). This depletion layer acts as a gate insulator, enabling the device to act as an FET.

Upon voltage being applied to the gate G of the device, as shown in FIG. 1A, the carrier concentration in the channel can be controlled over a certain range (e.g., about 0.01% to about 15%).

For example, a positive gate voltage (e.g., 3 V in FIG. 6), with the doping type represented in FIG. 1B, leads to a decrease in the carrier number in the channel, and a decrease in channel conductance.

Conversely, a negative voltage (e.g., typically in the range of about −1.1 V to about 0V in FIG. 6) leads to an increase in carrier number and an increase in conductance. The applicable negative voltage is limited by the onset of forward conduction across the depletion layer, which is a diode.

In the implementation discussed in D. M. Newns et al., "The JMTFET: a Reductionist but Potent MTFET Device", *IBM Report*, publication date to be determined, mentioned above, the depletion layer within the p-type channel could be varied over about 0.15 e per column, normal to the channel plane of a 1 unit cell area. If only a very thin layer (e.g., on the order of monolayers) of channel material is conducting, data on cuprates shows that (a) there will be an adequate channel "ON" conductance (e.g., of order 1 KΩ or less), and (b) the controllable depletion will be sufficient to turn off the channel conductivity.

In an exemplary implementation, the above-described device has been formed using p-type cuprate material as the channel material 2, and n-type STO as a high dielectric constant doped insulator material 4. The details and function of the as-fabricated device are provided in D. M. Newns et al., "The JMTFET: a Reductionist but Potent MTFET Device", *IBM Report*, publication date to be determined.

Briefly, the device preferably includes an STO substrate in the form of the stepped STO crystal with 0.1 atomic percent Nb doping. It has the advantages of a high quality surface combined with relatively low dopant concentration, which are essential for this device. Directly on top of the doped STO substrate, without any intervening STO layer, a layer of cuprate is deposited. In the exemplary constructions, 50 percent Pr 123 material was selected. The electrodes formed of Pt were deposited on the cuprate.

As mentioned above, the energy band diagram is illustrated in FIG. 1B, and the cuprate is a p-type material with the doped holes essentially residing in the oxygen p-bands. On the other hand, the doped STO is n-type with the electrons occupying the metal bands. It is believed that at the interface between the two materials the oxygen p-bands and the metal bands respectively line-up, oxygen with oxygen and metal with metal, as shown in FIG. 1B, within the error introduced by non-equivalence of the two oxide materials.

Given the assumed band alignment at the interface, equilibrium between the two materials results in a large depletion layer between the two materials, as shown in FIG. 1B, as in a p-n junction or, a somewhat closer analogy, in view of the much lower dopant concentration in the STO relative to the cuprate (e.g., a Schottky barrier).

The depletion layer provides an insulating barrier between the cuprate and the bulk of the Nb-STO crystal which will enable it to act as a field effect transistor over a limited range of voltage.

As compared with the JMTFET device described above, the MTFET described in C. Zhou et al., *Appl. Phys. Lett.*, 70.598 (1997) and U.S. patent application Ser. No. 08/652,286, mentioned above, filed May 22, 1996, commonly assigned, has an undoped insulator layer instead of a depletion layer (as in the JMTFET) as gate insulator material. Below, the relative advantages and disadvantages of the JMTFET relative to the MTFET, are discussed.

There has been no problem encountered making ohmic contact to doped cuprate materials (e.g. using Pt pads), and since the channel's default state is conducting, electrical contact between the source and drain electrodes and the channel is not likely to be problematic. In the MTFET, where the channel default state is usually insulating, good contact between source and drain electrodes and the conducting channel might be a problem in some structures.

Thin high dielectric constant films required in the MTFET show experimentally large drops in dielectric constant relative to bulk material. The depletion layer device has one homogeneous interface (e.g., no change in insulator material, only of carrier concentration), at the channel/insulator interface, and is thereby anticipated to encounter a reduced thin film dielectric constant problem.

The required channel structure of one or a few monolayers of conducting Mott insulator material, with superimposed layer of similar (e.g., epitaxial layer) but insulating protective material, is well adapted to fabrication by current layer by layer growth technology.

It is noted that the JMTFET is suitable for use in DRAM memory cells. However, the electrical character of the device can be potentially changed by inserting a dipole layer at the channel/dielectric interface, giving it the electrical characteristics of an enhancement mode device, when the JMTFET would become fully logic-enabled.

The width of the depletion layer may be estimated from $$W = \sqrt{\frac{2\epsilon_0 \epsilon_S (V_b + V_g)}{eN_D}} \quad (1)$$

where $\epsilon_S$ is the "background" dielectric constant in the STO, $N_D$ is the dopant concentration in the STO, $V_b$ is the barrier height from the Fermi level in the STO to the top of the conduction band at the interface (see FIG. 1B), $V_g$ is the gate voltage, e is the electronic charge (taken as positive) and $\epsilon_0$ is the vacuum dielectric constant.

Equation (1) is applied to the exemplary Nb-STO material, which is predicted to have the largest depletion layer width on account of its low dopant concentration and high dielectric constant. Assuming a dielectric constant $\epsilon_S$=200, and $V_g$=1.7 eV (from data below), a depletion layer thickness of 53 nm. is obtained at zero bias. Such a thickness is quite comparable with the thinner insulating STO layers fabricated in MOS MTFET structures. While the presence of ionized $Nb^+$ traps in the depletion barrier region is expected to produce some deterioration in its dielectric qualities, in fact the depletion layer performs well as an insulating layer.

Figure 2:
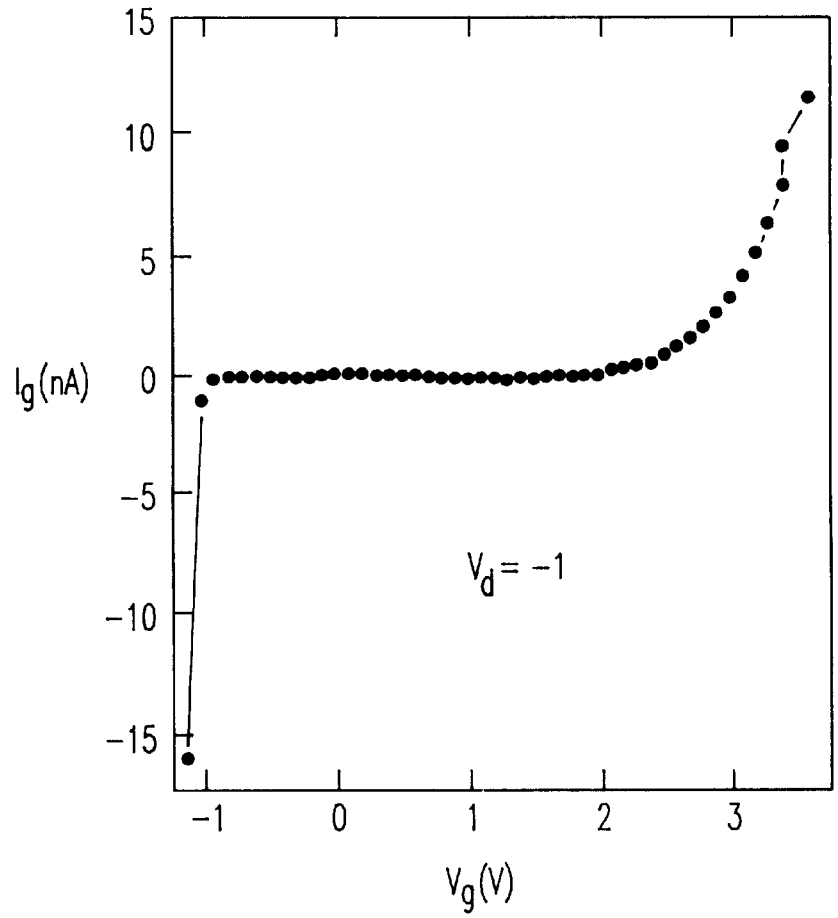
FIG. 2 is a graph showing gate-to-drain current $I_g$ versus gate voltage $V_g$ for the device of FIG. 1 according to the present invention.

Regarding gate characteristics of the device, the characteristic gate current-gate voltage plot is illustrated in FIG. 2. Specifically, FIG. 2 is a graph showing gate-to-drain current $I_g$ versus gate voltage $V_g$ for the device of FIG. 1A according to the present invention.

Figures 3A, 3B:
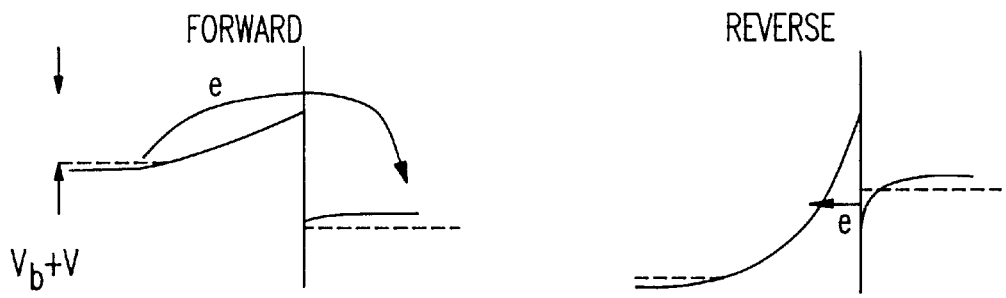
FIG. 3A illustrates band bending at the junction in forward bias and FIG. 3B illustrates band bending at the junction in reverse bias.

The behavior of the gate current in FIG. 2 can be understood from the band bending diagram in FIGS. 3A and 3B. FIG. 3A illustrates a band bending at the junction in forward bias and FIG. 3B illustrates a band bending at the junction in reverse bias.

In forward bias, gate negative, (e.g., see FIG. 3A) the barrier to excitation of STO electrons over to the cuprate side of the junction is decreasing as $V_b+V_g$ where $V_g$ is negative, until thermal excitation over the barrier becomes probable and a large negative gate current starts to flow.

In reverse bias (e.g., see FIG. 3B), the barrier becomes thinner, until tunneling current (or other conducting mechanism) is initiated. Between these two regions, the gate current is very low (sub-nanoamp; measured at approximately $10^{-12}$ Amps) and the depletion layer acts as an effective insulator. In this region, the device can be used as an FET.

Regarding voltage-dependent capacitance, it is known that at a metal-semiconductor junction, the capacitance is a function of the voltage, because the thickness of the depletion layer is itself a function of the voltage (e.g., see Equation 1 above).

Figure 4:
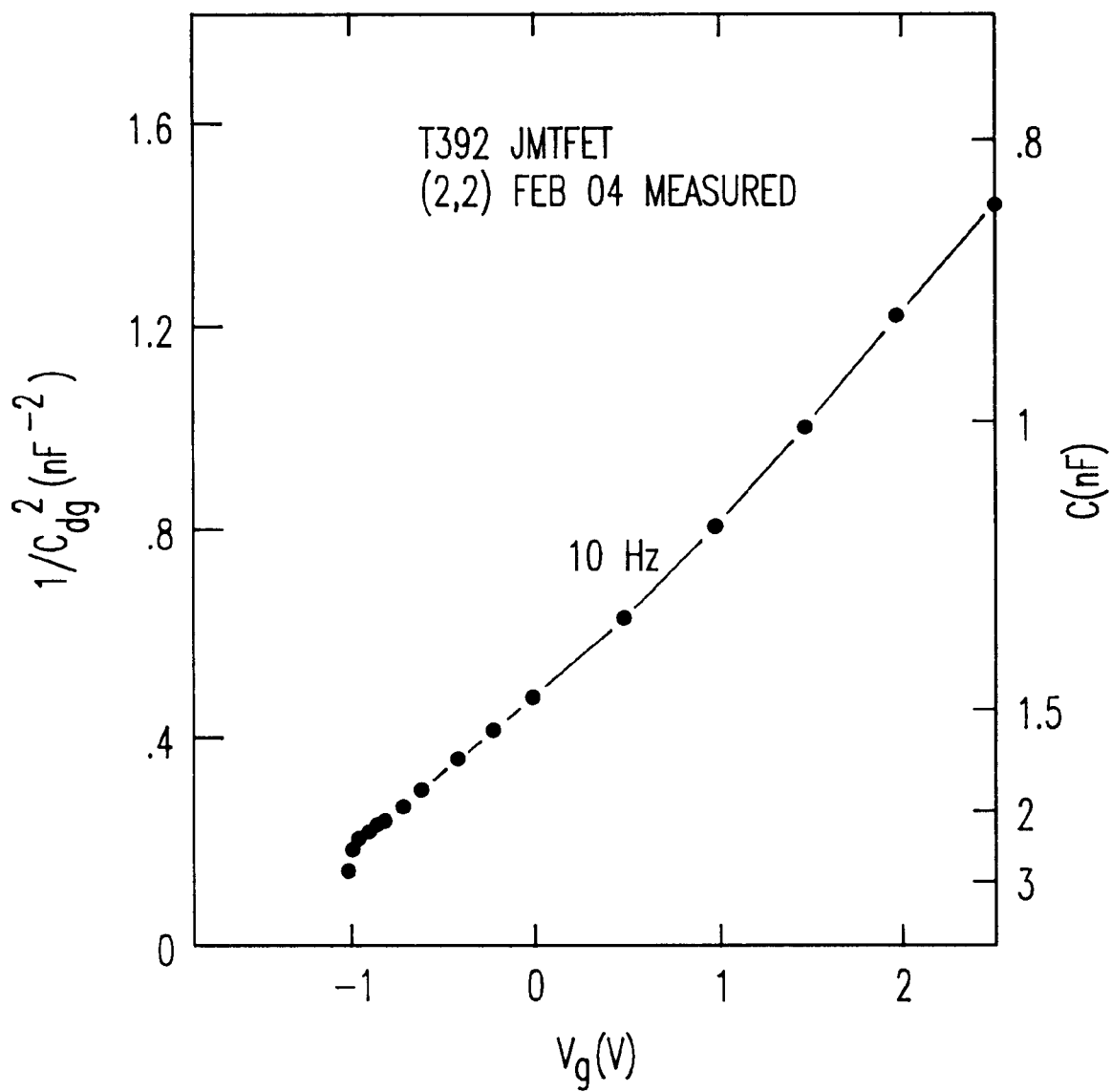
FIG. 4 is a graph showing $1/C^2$ versus voltage plot of gate-to-drain capacitance as a function of gate voltage, with capacitance measured at 10 Hz.

FIG. 4 illustrates a plot of the capacitance and specifically the quantity $C^{-2}$ on the left hand side of versus $V_g$ for a particular device. In the graph of FIG. 4 showing $1/C^2$ versus voltage plot of gate-to-drain capacitance as a function of gate voltage, the capacitance is measured at 10 Hz, and all devices measured exhibited similar behavior.

Figure 5:
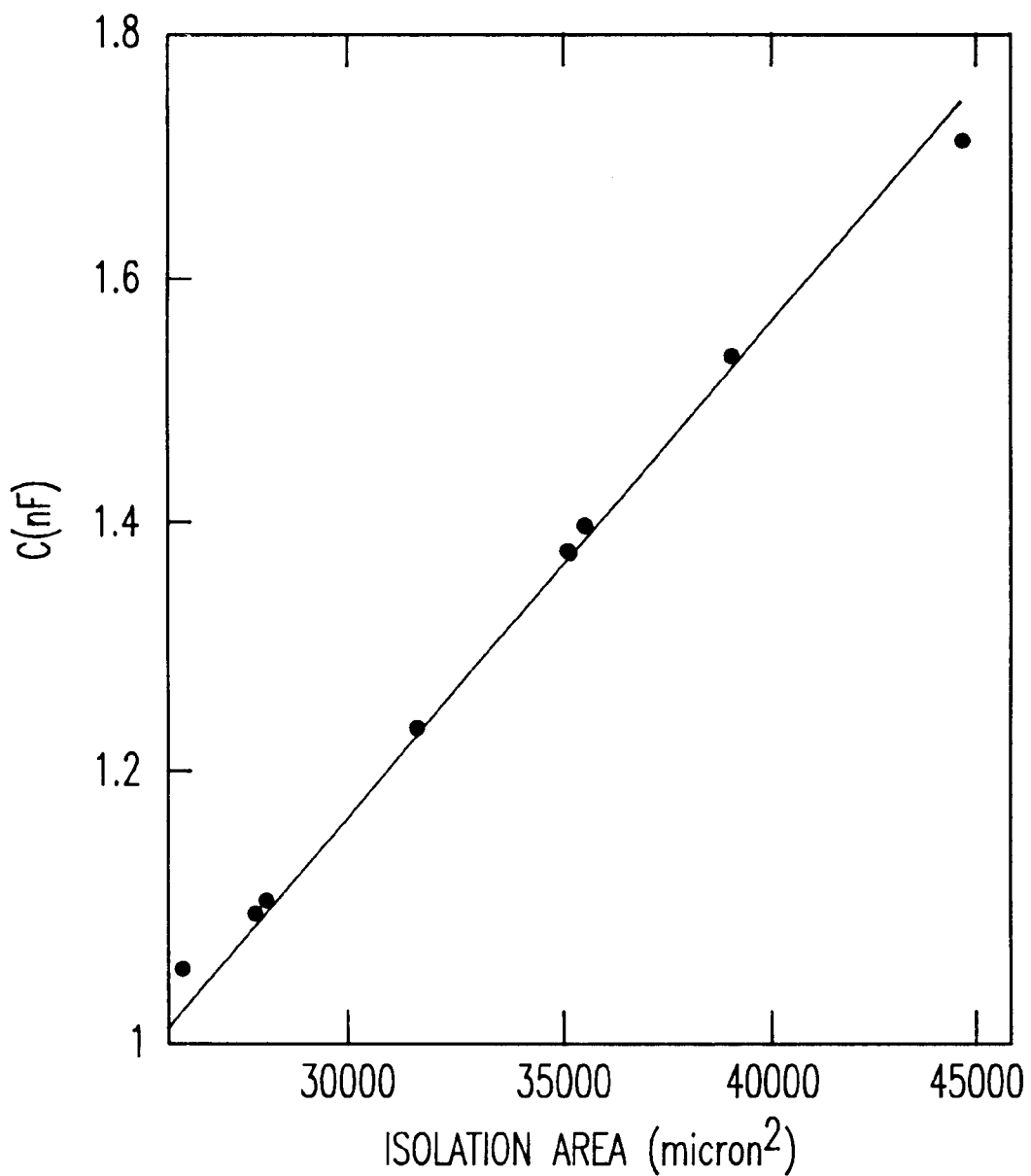
FIG. 5 is a graph showing scaling of capacitance of various pads, large and small type, measured at 10 Hz, plotted versus isolation area with a linear scaling indicating that the whole isolation area is involved in capacitance.

From the slope and the intercept of the exemplary plot of FIG. 5, the dielectric constant in the depletion layer, and the barrier height can be determined. FIG. 5 is a graph showing scaling of capacitance of various pads, large and small type, measured at 10 Hz, plotted versus isolation area with a linear scaling indicating that the whole isolation area is involved in capacitance.

From the intercept, a value of approximately $V_b=1.7$ eV for the barrier height. Since the STO energy gap is 3.0 eV, the cuprate Fermi level lies slightly below mid-gap at the STO-cuprate interface (e.g., 1.3 eV above the valence band and 1.7 eV below the conduction band). Such a value aids in understanding the nature of insulator breakdown when gate voltage is applied to the MTFET Before considering the slope, the area of the capacitor formed by the depletion layer in the Nb-STO is defined. Measurements were made at 10 Hz. At this low frequency, it is believed that the whole cuprate layer inside the isolation rectangle is contributing to the capacitance of any device. To confirm such a belief, FIG. 5 plots how the device capacitances scale with isolation area. Despite a mixture of small and large devices being measured, there is a good scaling with isolation area, confirming the validity of this assumption.

From the slope, a value of approximately $\epsilon_S=200$ for the dielectric constant of the depletion layer, which represents a good value for a 50 nm.-thick layer. Thin STO films normally have reduced values of the dielectric constant.

Regarding the nonlinear effect, some upward curvature is noted in the "linear" plot of FIG. 4. This is most plausibly attributed to the known nonlinear polarizability property of STO.

The nonlinear effect is seen to be non-negligible, with about a 50 percent reduction in capacitance, and to be of the same order as that to be expected from typical measurements.

Figure 6:
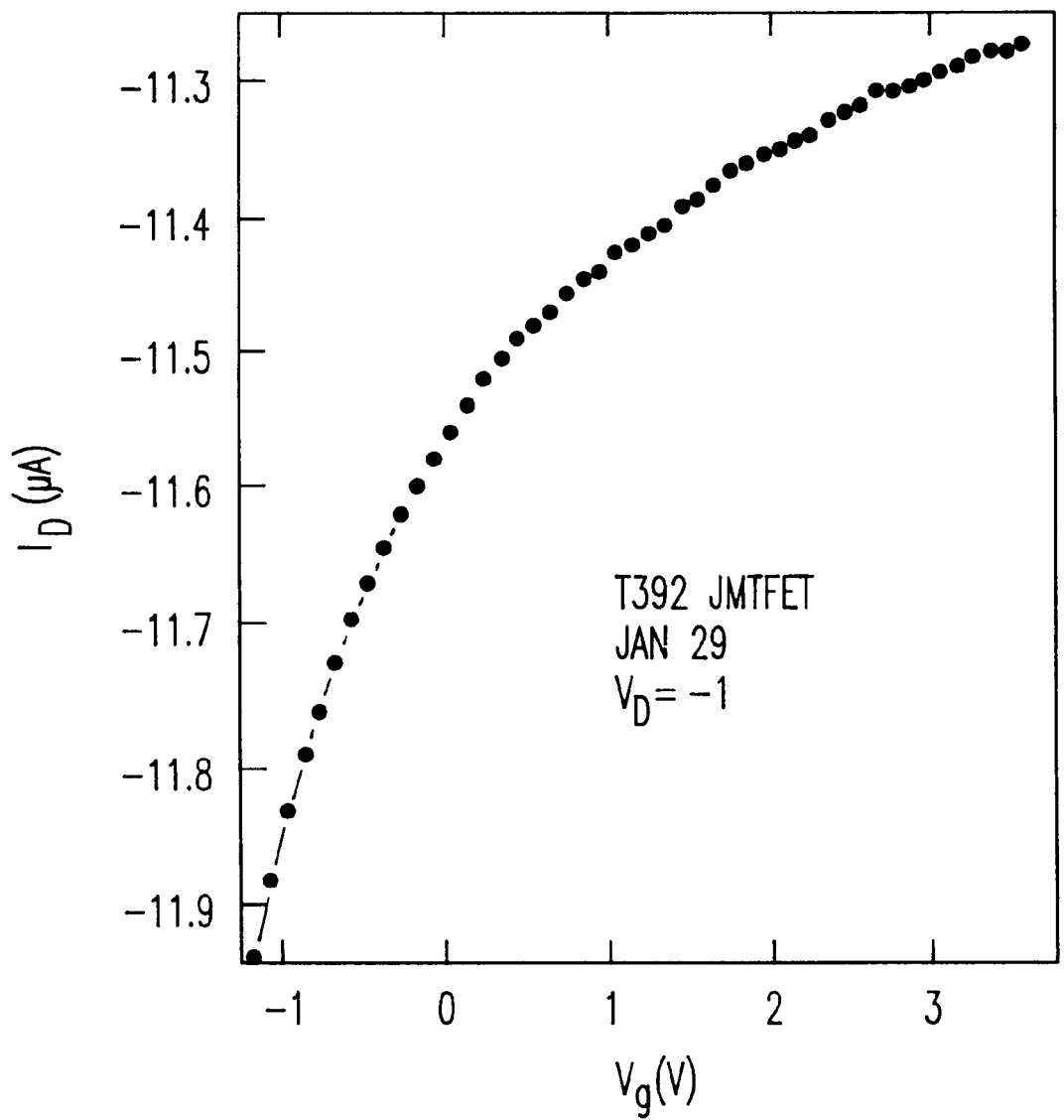
FIG. 6 is a graph showing drain current versus gate voltage in the device shown in FIG. 1 according to the present invention.

Regarding transconductance, the operation of the device as a JMTFET is illustrated in FIG. 6 which shows the drain current versus gate voltage. Specifically, FIG. 6 is a graph showing drain current versus gate voltage in the device shown in FIG. 1 according to the present invention.

The cuprate layer (50 percent Pr) is not very conductive. The JMTFET device is intrinsically depletion mode, in that the formation of the depletion layer in the Nb-STO also gives rise to a much thinner depletion layer in the cuprate, but with the same charge per unit area. Therefore, from the depletion layer thickness, at zero bias a 13 percent doping of the cuprate per column of area of one unit cell, which is a relatively large effect. However, in a sample on the order of 36 nm. thick (e.g., 30 unit cells), it is expected only to modulate the conductance by a few percent in depletion mode. Thus, a practical device (e.g., JMTFET) requires very few conducting layers in the channel to achieve a high ON/OFF value.

As shown, the type of characteristic expected in the JMTFET differs from that in the conventional MTFET.

Figure 7:
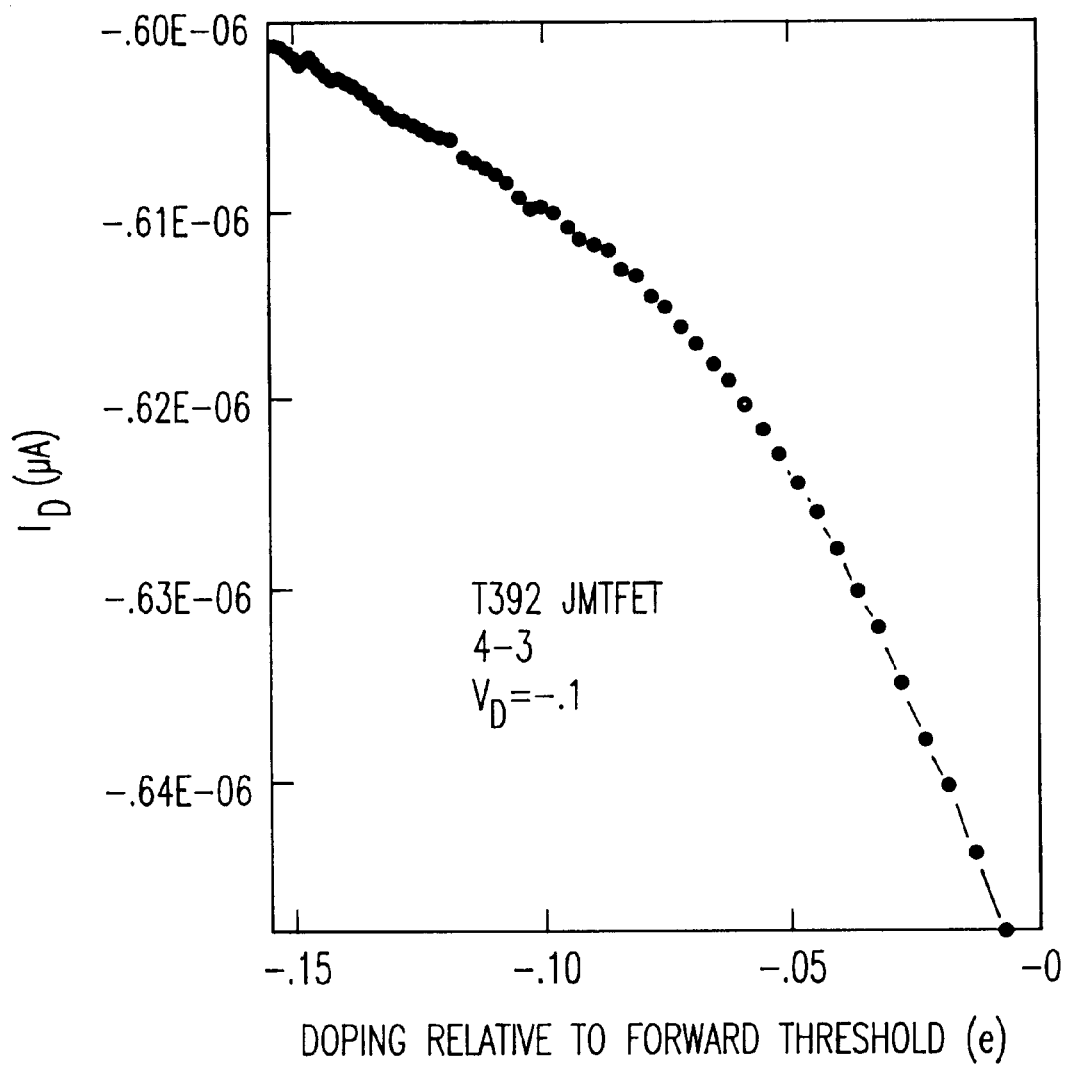
FIG. 7 is a graph showing drain current versus gate-induced charge per area of one unit cell, with the charge being measured relative to the forward conduction threshold, at −1.12 V.

FIG. 7 illustrates drain current versus gate-induced charge per area of one unit cell. Specifically, FIG. 7 is a graph showing drain current versus gate-induced charge per area of one unit cell, with the charge being measured relative to the forward conduction threshold, at $-1.12$ V. In FIG. 7, the plot is still nonlinear, indicating that there is a higher carrier mobility when the interface carrier concentration is large, as at negative $V_g$ (forward bias), and a lower carrier mobility at reverse bias when the carrier concentration at the interface is low. This variation of mobility with concentration is characteristic for cuprate materials.

It is noted in FIG. 7 that the range of doping which can be modulated by the gate voltage is large (e.g., about 15 percent, which is about $10^{14}$ carriers per $cm^2$).

The modulation of channel current $I_D$ achieved is about 5–10 percent. In view of the above result for the range of carrier concentration modulation, 0.15, and the channel thickness, about 30 unit cells of material, a doping is on the order of about 0.05–0.1 per unit cell of three copper layers.

Another more fundamental way to plot the FIG. 7 result is via a plot of differential conductance, $d\sigma/d\delta$. If this measurement is constant, a constant mobility is implied. Fitting data of FIG. 7 to a third order polynomial, and differentiating the same, the result is illustrated in FIG. 8.

Figure 8:
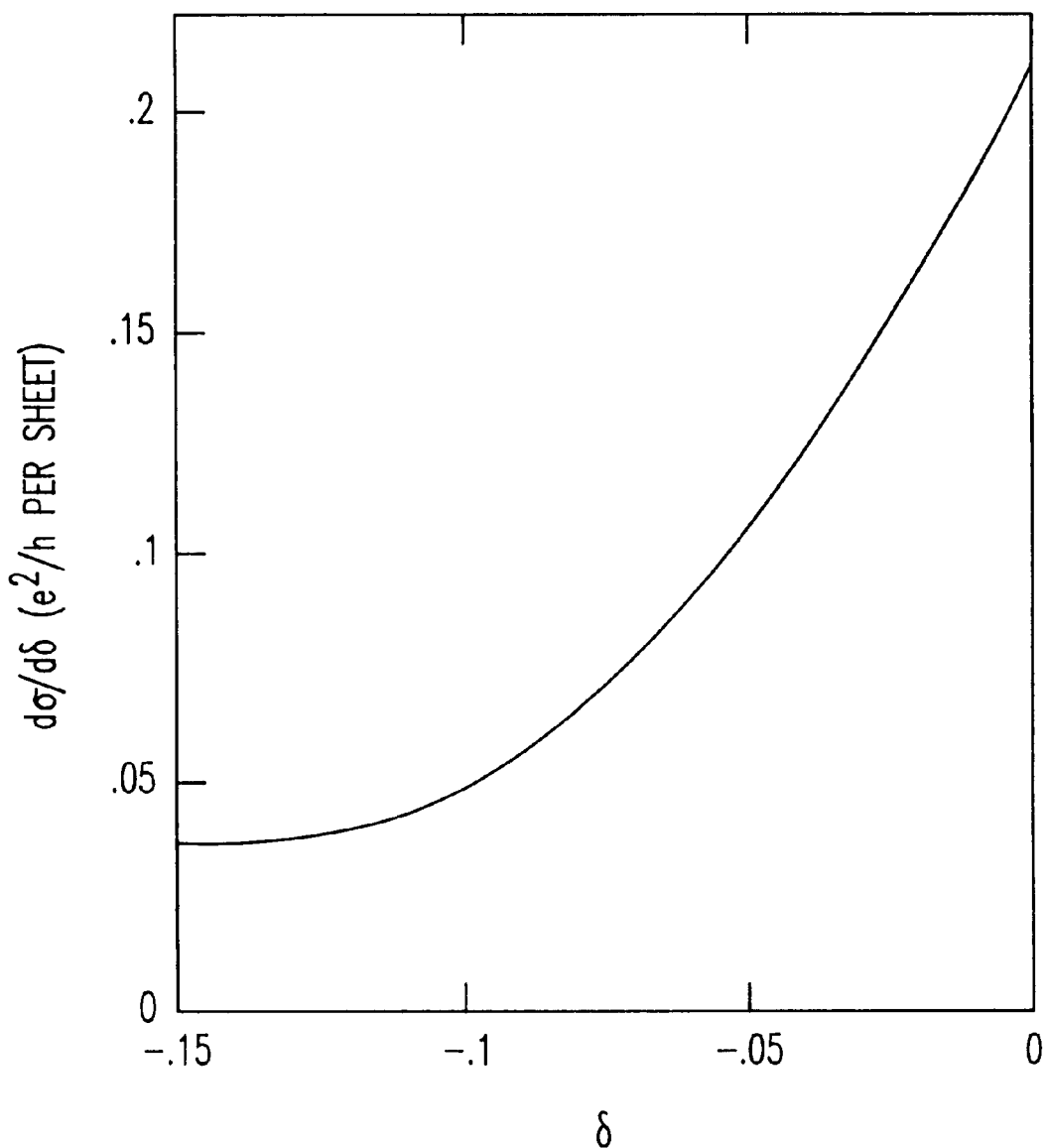
FIG. 8 is a graph showing differential conductance versus gate-induced charge per area of one unit cell of the device of FIG. 1 according to the present invention, scaled in terms of conductance, with the charge being measured relative to the forward conduction threshold.

FIG. 8 is a graph showing differential conductance versus gate-induced charge per area of one unit cell of the device of FIG. 1 according to the present invention, scaled in terms of conductance, with the charge being measured relative to the forward conduction threshold. As shown, the differential conductance increases rapidly with doping, due to the approach of the sample towards metallization. The data in FIG. 8 are scaled in terms of conductance.

Thus, the JMTFET configuration is advantageous in its capability to influence channel carrier concentration with only a few volts on the gate.

Briefly, an exemplary method of fabricating the structure of the present invention, includes depositing an approximately 100 Å thick layer formed of a p-doped Mott insulator $Y_{0.5}Pr_{0.5}Ba_2Cu_3O_{7-\delta}$ by laser ablation onto a crystalline substrate of 0.01 atomic percent Nb-doped $SrTiO_3$, with a stepped surface having a high degree of flatness. Platinum electrodes are deposited through a stencil mask by electron beam evaporation of platinum in vacuum, to complete the structure according to the present invention.

Another exemplary method of manufacturing the structure includes depositing $Pb_{0.5}Y_{0.5}Ba_2Cu_3O_{7-\delta}$ in a thickness of approximately 300 Å, by laser ablation onto a high quality, stepped single crystal substrate surface of 0.1 atomic percent Nb-doped STO. The Pt electrodes are deposited by evaporation in vacuum through a stencil mask.

With the JMTFET device described above, some of the parameters of the device are illustrated below in Table 1. The JMTFET achieves large modulations of channel carrier concentration with relatively low gate voltages. With a properly designed channel, consisting of only a few molecular layers of high mobility material, very good results are achieved.

Simultaneously, the JMTFET is simple to fabricate, only the channel layer, including its growth and structure, pose fabrication challenges, the key features of the insulator being built in by the manufacturer.

The device exhibits classic Schottky diode behavior.

The deduced magnitudes of the barrier ($V_b=1.7$ eV), and of the surface dielectric constant ($\epsilon_S=200$) are reasonable. The barrier magnitude puts the cuprate Fermi level slightly below the mid-gap of the STO, consistent with the gate characteristics of the MTFET. The surface dielectric constant is somewhat lower than bulk STO values, as is usually the case in a thin layer. The magnitude of the transconductance is consistent with that expected in a depletion mode device with the above-mentioned channel material, which is relatively not very conducting.

Table 1 exhibits some JMTFET parameters, with: $\delta_{Nb}$ being the doping in electrons per cell in an Nb-STO substrate; $\epsilon_S$ being the dielectric constant in an Nb-STO surface layer; W being a width of the depletion layer at zero bias; $V_b$ being an energy barrier for Nb-STO electrons at zero bias; and $\Delta\delta_{Cu}$ being a range over which doping in a cuprate channel can be varied, in electrons per unit cell area.

TABLE 1

| $\delta_{Nb}$ | $\epsilon_S$ | W (nm.) | $V_b$ | $\Delta\delta_{Cu}$ |
|---|---|---|---|---|
| 0.001 | 200 | 53 | 1.7 | 0.15 |

While the invention has been described in terms of several preferred embodiments, those skilled in the art will recognize that the invention can be practiced with modification within the spirit and scope of the appended claims.

For example, while the present invention has been described for potential use in dynamic random access memories (DRAMs), the invention would find benefit and potential use in other application including logic devices and circuitry.

What is claimed is:

1. A device, comprising:
   a channel material;
   first and second contacts formed on a first side of said channel material;
   a film of doped first insulator material interposed between said first and second contacts;
   a second insulator material interfaced with said doped first insulator material with an area of said channel material therebetween; and
   a gate formed at a second side of said channel material, said second side of said channel material being opposed to said first side of said channel material,
   said second insulator material begin doped so as to have carriers of opposite charge to those in the channel material.

2. The device according to claim 1, wherein said first and second contacts comprise source and drain contacts, respectively.

3. The device according to claim 1, wherein said doped first insulator material comprises a doped Mott insulator.

4. The device according to claim 1, wherein said second insulator material is interfaced epitaxially with said doped first insulator material.

5. The device according to claim 3, wherein said second insulator material is interfaced epitaxially with said doped first insulator material.

6. The device according to claim 1, wherein said device forms a switch controlled by voltage applied to the doped first insulator material, thereby functioning as a gate electrode in the device.

7. The device according to claim 1, wherein said channel material includes an active channel material layer selected for its capability to undergo Mott metal-insulator transition, and
   wherein said first and second contacts are separated by said active channel material layer.

8. The device according to claim 1, wherein said channel material comprises a p-type active channel material layer.

9. The device according to claim 1, wherein a portion of the channel material lying between the first and second contacts includes a thin active material layer having a thickness smaller than said channel material on which said first and second contracts are respectively formed,
   said thin active material layer being embedded in said first insulator, said doped first insulator being closely compatible material to the active material thin layer.

10. The device according to claim 1, wherein said second insulator material comprises a relatively high dielectric constant material.

11. The device according to claim 10, wherein said high dielectric constant material comprises a ferroelectric perovskite including at least one of strontium titanate (STO) and barium strontium titanate (BST).

12. A device, comprising:
    a channel material;
    first and second contacts formed on said channel material;
    a film of doped first insulator material interposed between said first and second contacts;
    and
    a second insulator material interfaced with said doped first insulator material with an area of said channel material therebetween, and
    said second insulator material begin doped so as to have carriers of opposite charge to those in the channel material,
    wherein said second insulator material comprises a relatively high dielectric constant material, comprising a ferroelectric perovskite including strontium titanate (STO) doped with a predetermined concentration of Nb.

13. The device according to claim 12, wherein said channel material comprises a p-type channel material layer.

14. The device according to claim 1, wherein said second insulator material comprises an n-type high dielectric constant material.

15. The device according to claim 14, wherein said high dielectric constant material comprises an n-type layered cuprate material, and wherein said channel material comprises a p-type channel material layer,
    wherein bands in the p-type channel material layer approximately line up with those of the n-type material of the second insulator material at the interface thereof,
    wherein when the first and second insulator materials are in equilibrium at zero bias, a depletion layer is formed, and wherein a majority of a depletion layer resides in the high dielectric constant material,
    said depletion layer functioning as a gate insulator for enabling the device to act as a field effect transistor (FET).

16. The device according to claim 15, wherein, upon voltage being applied to said gate of the device formed on the high dielectric constant material side of the device, the carrier concentration in the channel is controllable.

17. The device according to claim 16, wherein said channel material comprises a p-type channel material layer,
    wherein a positive gate voltage decreases a carrier number in the channel, and decreases channel conductance, and
    wherein a negative voltage increases a carrier number and increases channel conductance.

18. The device according to claim 17, wherein said channel material includes a p-type cuprate material and wherein said high dielectric constant material includes STO.

19. The device according to claim 1, wherein a channel is formed between said first and second contacts, the channel including at least one monolayer of conducting Mott insulator material.

20. The device according to claim 9, wherein said channel material on which said first and second contacts is formed has a thickness substantially within a range of about 3 nm. to about 30 nm.

21. The device according to claim 20, wherein said channel material on which said first and second contacts is formed has a thickness substantially about 10 nm.

22. The device according to claim 1, wherein said second insulator material has a dielectric constant substantially within a range of about 200 to about 1000.

23. A dynamic random access memory (DRAM), comprising:
    a switch, said switch including:
        a channel material;
        first and second contacts formed on a first side of said channel material;
        a film of doped first insulator material interposed between said first and second contacts;
        a second insulator material interfaced with said doped first insulator material with an area of said channel material therebetween; and
        a gate formed at a second side of said channel material, said second side of said channel material being opposed to said first side of said channel material,
    said second insulator material begin doped so as to have carriers of opposite charge to those in the channel material.

24. The DRAM according to claim 23, wherein said second insulator material is doped so as to have carriers of opposite charge to those in the channel material.

* * * * *